United States Patent
Muto

(10) Patent No.: US 7,585,733 B2
(45) Date of Patent: Sep. 8, 2009

(54) METHOD OF MANUFACTURING SEMICONDUCTOR DEVICE HAVING MULTIPLE GATE INSULATION FILMS

(75) Inventor: Koki Muto, Sendai (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 330 days.

(21) Appl. No.: 11/275,825

(22) Filed: Jan. 30, 2006

(65) Prior Publication Data

US 2006/0194393 A1    Aug. 31, 2006

(30) Foreign Application Priority Data

Feb. 28, 2005    (JP) .............................. 2005-052298

(51) Int. Cl.
*H01L 21/336*    (2006.01)
(52) U.S. Cl. ..................................................... 438/279
(58) Field of Classification Search ................. 438/157, 438/199, 250, 257, 258, 275, 279, 294, 420, 438/439, 587, 981; 257/324, E21.209, E29.264, 257/392, E29.132, E21.192
See application file for complete search history.

(56) References Cited

U.S. PATENT DOCUMENTS

| | | | | |
|---|---|---|---|---|
| 4,317,690 A | * | 3/1982 | Koomen et al. ............. 438/250 |
| 4,516,316 A | * | 5/1985 | Haskell ....................... 438/420 |
| 5,595,922 A | * | 1/1997 | Tigelaar et al. ............. 438/587 |
| 5,989,962 A | * | 11/1999 | Holloway et al. ........... 438/275 |
| 6,194,257 B1 | * | 2/2001 | Kwon ......................... 438/199 |
| 6,268,266 B1 | * | 7/2001 | Hwang et al. ............... 438/439 |
| 6,346,442 B1 | * | 2/2002 | Aloni et al. ................. 438/258 |
| 2005/0136595 A1 | * | 6/2005 | Horie .......................... 438/257 |

FOREIGN PATENT DOCUMENTS

| | | | |
|---|---|---|---|
| JP | 2000/150665 A | 5/2000 |
| JP | 2000/164726 A | 6/2000 |
| JP | 2000/200836 A | 7/2000 |

* cited by examiner

*Primary Examiner*—Ha Tran T Nguyen
*Assistant Examiner*—Shaun Campbell
(74) *Attorney, Agent, or Firm*—Rabin & Berdo, P.C.

(57) ABSTRACT

A method of manufacturing a semiconductor device includes the steps of: preparing a semiconductor substrate having first and second element forming regions, the first and second element forming regions divided by an element separating insulation film; forming a first gate insulation film on the semiconductor substrate; forming a predetermined film on the first gate insulation film; forming a protective film on the predetermined film in the first element forming region; forming a second gate insulation film in the second element forming region by deforming the predetermined film into an insulation film using the protective film as a mask; removing the protective film and the remaining predetermined film which is not deformed into the insulated film; and forming gate electrodes on the first and second gate insulation films which are exposed by removing the remaining predetermined film.

3 Claims, 8 Drawing Sheets

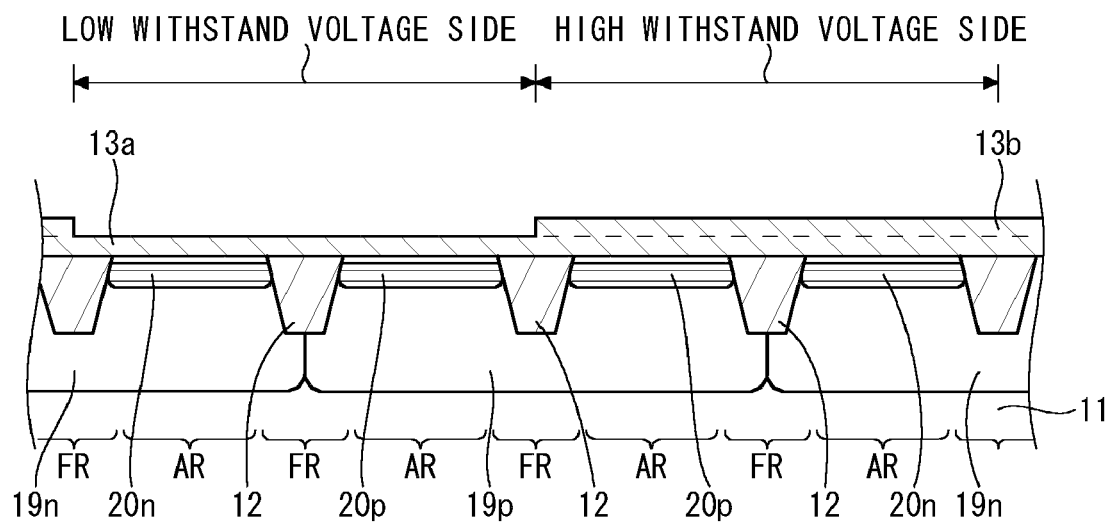
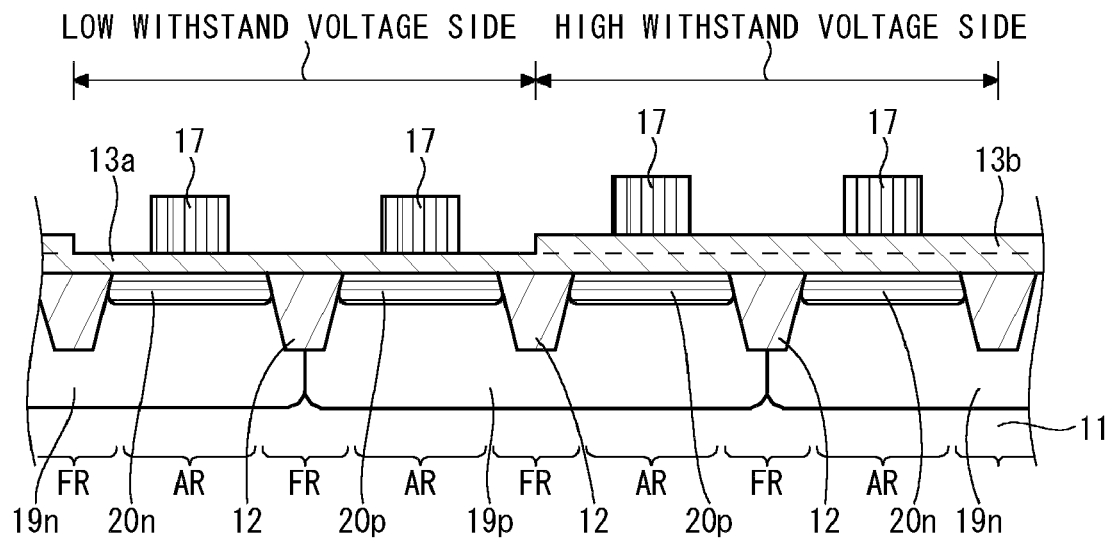

METHOD OF MANUFACTURING SEMICONDUCTOR DEVICE HAVING MULTIPLE GATE INSULATION FILMS

BACKGROUND OF THE INVENTION

1. Field of the Invention

The present invention relates to a method of manufacturing a semiconductor device, which in particular has transistors for different withstand voltages.

2. Background Information

With respect to a conventional semiconductor device having transistors for different withstand voltages (e.g. Japanese Laid Open Patent Application No. 2000-150665 (hereinafter to be referred to as Patent Reference 1), Japanese Laid Open Patent Application No. 2000-200836 (hereinafter to be referred to as Patent Reference 2) and Japanese Laid Open Patent Application No. 2000-164726 (hereinafter to be referred to as Patent Reference 3), the transistors for different withstand voltages are formed on the same semiconductor substrate by normally using gate oxide films with different thicknesses. FIG. 1 and FIG. 2 show the manufacturing processes of a conventional semiconductor device having transistors for different withstand voltages.

Then, by conducting a thermal oxidation treatment on the surface of the semiconductor substrate 101, a gate oxide film 103A is formed on the entire surface of the semiconductor substrate 101, as shown in FIG. 1B. The gate oxide film 103A is thinner than a gate oxide film for high withstand voltage.

Next, a predetermined resist solution is spin-coated over the gate oxide film 103A after which a known photolithography process is conducted to form a resist pattern R101 only in a region on the side of high withstand voltage. Then, using the resist pattern R101 as a mask, the gate oxide film 103A in a region on the side of low withstand voltage is removed by a known etching method. Through such process, a gate oxide film 103a will remain only in the region on the high withstand voltage side, as shown in FIG. 1C. The resist pattern R101 on the remaining gate oxide film 103a is removed after the etching process is finished.

Next, by conducting a thermal oxidation treatment on the entire surface of the semiconductor substrate 101, a gate oxide film 104 with a thickness suited for low withstand voltage is formed on the entire surface, as shown in FIG. 2A. By this arrangement, a gate oxide film 103, which is a laminated product of the gate oxide film 103a and the gate oxide film 104, will be formed in the region on the high withstand voltage side. Accordingly, the thickness of the gate oxide film 103A (FIG. 1B) should be set so that the thickness of the laminated product of the gate oxide film 103a and the gate oxide film 104 is suited for high withstand voltage.

Next, a polysilicon is deposited over the entire surface of the semiconductor substrate 101 on which the gate oxide film 103a and the gate oxide film 104 are formed, and then processed by a known photolithography process and etching process to have a gate pattern 107a formed on the gate oxide film 104 in the active region AR on the low withstand voltage side, and a gate pattern 107b formed on the gate oxide film 103 in the active region AR on the high withstand voltage side, as shown in FIG. 2B.

Through the above described processes, it is possible to manufacture a semiconductor device having a transistor for low withstand voltage and a transistor for high withstand voltage formed on the same substrate.

However, according to the conventional art described above, since the gate oxide film 103A is thin, it is a problem in that the element isolating insulation films 102 in the field regions FR, particularly in the vicinity of the active regions AR, may be removed to an extent more than necessary, which may result in producing dimples on the element isolating insulation films 102. FIG. 3A shows an enlarged view of the field region FR at the process of etching the gate oxide film 103A (FIG. 1C) on the low withstand voltage side.

As shown in FIG. 3A, a dimple 101a is formed at the border between the element isolating insulation film 102 and the active region AR, and when the thermal oxidation treatment for forming the gate oxide film 104 takes place in such a state, the gate oxide film 104 will end up having a dimpled surface (i.e. a dimple 101b, FIG. 3B) as it is formed along the dimple 101a, as shown in FIG. 3B.

This dimple 101b can cause problems such as an unnecessary concentration of electric field in the dimple 101b, the gate oxide film 104 at the dimple 101b not becoming an appropriate thickness, and so forth. These problems can become triggers for other problems such as deterioration of the withstand voltage of the gate oxide film 104, etc.

Furthermore, this dimple 101b can cause materials of the gate pattern 107 (i.e. a poly-silicon 107c, FIG. 3B) to unnecessarily remain in the dimple 101b at the time of forming the gate pattern 107, as shown in FIG. 3B, and this can cause a short circuit of the gate.

In view of the above, it will be apparent to those skilled in the art from this disclosure that there exists a need for an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide a method of manufacturing a semiconductor device which makes it possible to prevent withstand voltage deterioration of the gate insulation films, short circuits of the gates, and other possible problems.

In accordance with an aspect of the present invention, a method of manufacturing a semiconductor device comprises the steps of: preparing a semiconductor substrate having first and second element forming regions, the first and second element forming regions divided by an element separating insulation film; forming a first gate insulation film on the semiconductor substrate; forming a predetermined film on the first gate insulation film; forming a protective film on the predetermined in the first element forming region; forming a second gate insulation film in the second element forming region by deforming the predetermined film into an insulation film using the protective film as a mask; removing the protective film and the remaining predetermined film which is not deformed into the insulated film; and forming exposed gate electrodes on the first and second gate insulation films.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 8A to FIG. 8B are diagrams showing processes of forming the semiconductor device according to the first embodiment of the present invention.

DETAILED DESCRIPTION OF THE PREFERRED EMBODIMENT

A selected embodiment of the present invention will now be explained with reference to the drawings. It will be apparent to those skilled in the art from this disclosure that the following descriptions of this embodiment of the present invention are provided for illustration only and not for the purpose of limiting the invention as defined by the appended claims and their equivalents.

Structure

Figure 1A:
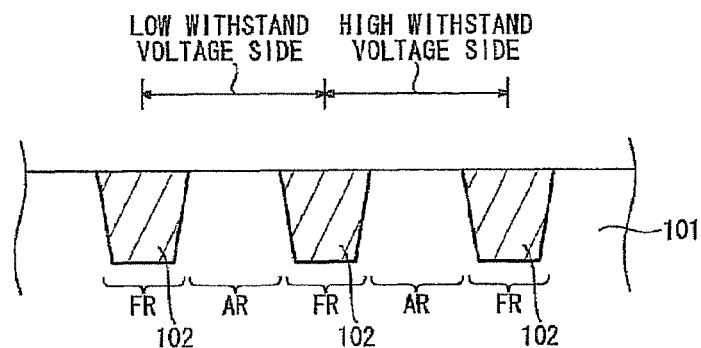
FIG. 1A to FIG. 1C are diagrams showing a conventional method of forming a semiconductor device having a transistor for low withstand voltage and a transistor for high withstand voltage formed on a single semiconductor substrate.
Figure 1B:
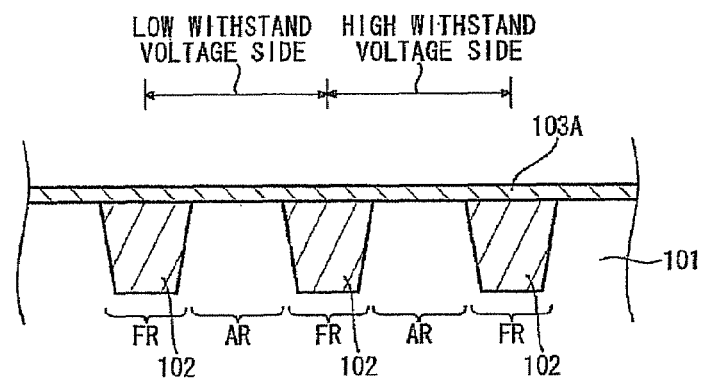
Figure 1C:
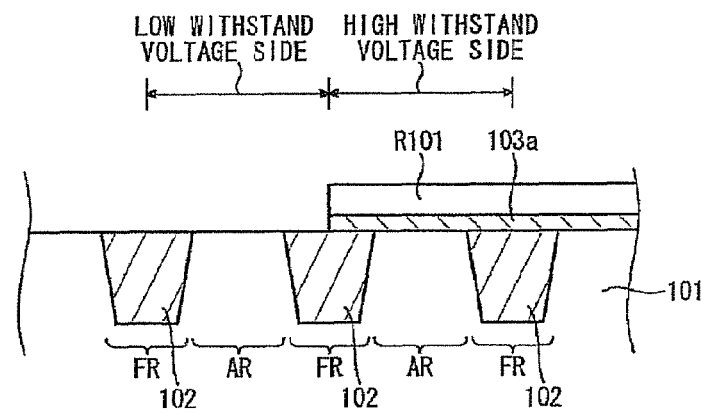
Figure 2A:
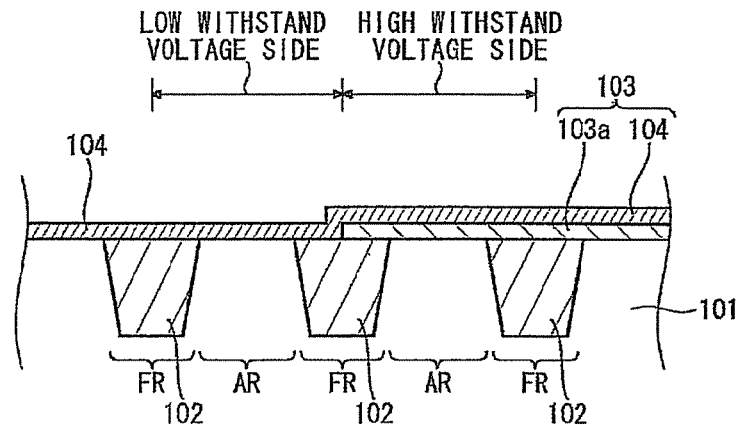
FIG. 2A to FIG. 2C are diagrams showing a conventional method of forming the semiconductor device having the transistor for low withstand voltage and the transistor for high withstand voltage formed on the single semiconductor substrate.
Figure 2B:
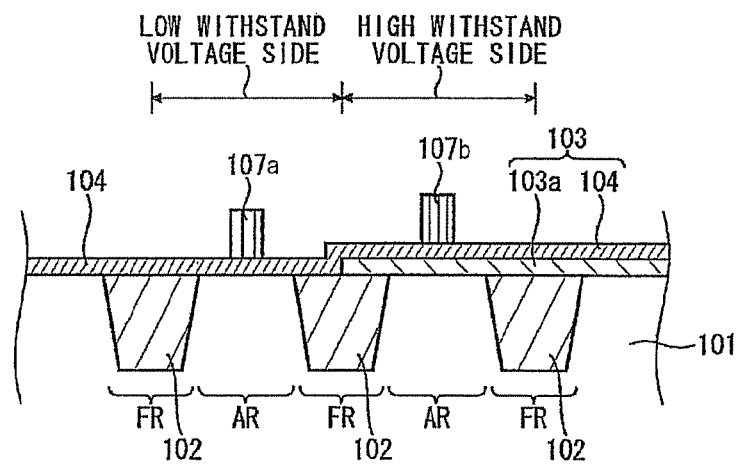
Figure 2C:
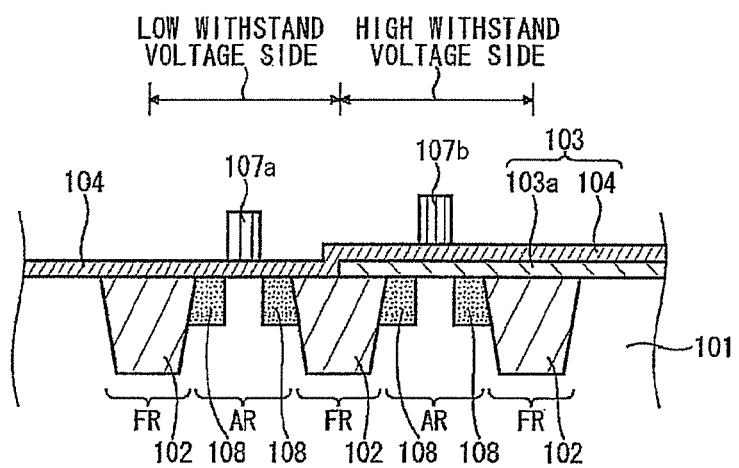
Figure 3A:
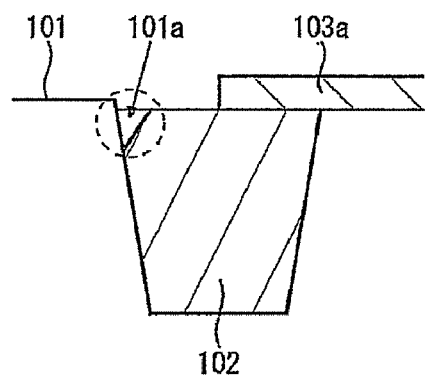
FIG. 3A and FIG. 3B are diagrams for explaining problems with respect to the semiconductor device having the transistor for low withstand voltage and the transistor for high withstand voltage formed on the single semiconductor substrate produced according to the conventional method shown in FIGS. 1 and 2.
Figure 3B:
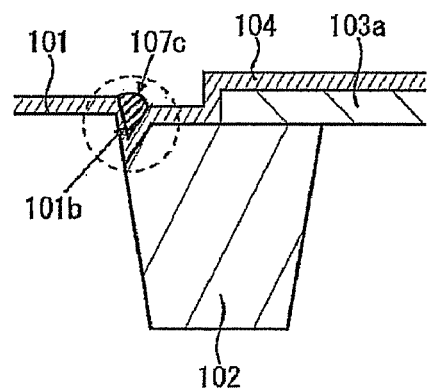
Figure 4:
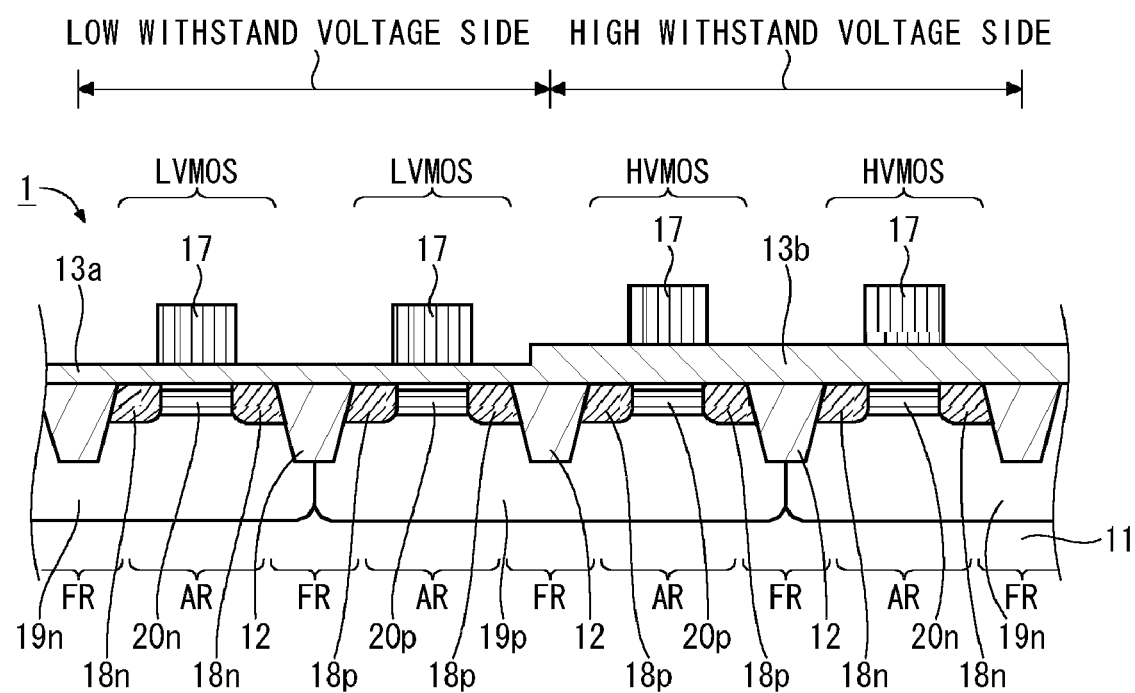
FIG. 4 is a diagram showing the structure of a semiconductor device according to a first embodiment of the present invention.

FIG. 4 is a diagram showing the structure of a semiconductor device 1 according to a first embodiment of the present invention. In the following, each process in manufacturing the semiconductor device 1 according to the manufacturing method of the present invention will be described based on a sectional structure of the semiconductor device 1 which includes a line linking low withstand voltage MOS (metal oxide semiconductor) transistors LVMOS and high withstand voltage MOS transistors HVMOS and which is vertical with a semiconductor substrate 11.

As shown in FIG. 4, the semiconductor device 1 has a structure in which active regions (also referred to as element forming regions) AR and field regions (also referred to as element isolating regions) FR are defined by having element isolating insulation films 12 formed on the semiconductor substrate 11.

On the surface of the semiconductor substrate 11 on the side where the low withstand voltage MOS transistors LVMOS are to be formed (hereinafter to be referred to as the low withstand voltage side), a gate oxide film 13a having a certain thickness (i.e. a first thickness) is formed. On the parts of the gate oxide film 13a in the active regions AR of the low withstand voltage side, gate electrodes 17 are formed. In each of these active regions AR, a pair of highly doped regions 18p or 18n are formed in a way sandwiching a region beneath the gate electrode 17. In other words, each low withstand voltage MOS transistor LVMOS includes the gate oxide film 13a having the first thickness which is formed on the active region AR of the semiconductor substrate 11, the gate electrode 17 formed on this gate oxide film 13a, and a pair of highly doped regions 18p or 18n formed in the active region AR.

On the other hand, on the surface of the semiconductor substrate 11 on the side where the high withstand voltage MOS transistors HVMOS are to be formed (hereinafter to be referred to as the high withstand voltage side), a gate oxide film 13b having a certain thickness (i.e. a second thickness) which is thicker than the first thickness is formed. On the parts of the gate oxide film 13b in the active regions AR of the high withstand voltage side, gate electrodes 17 are formed. In each of these active regions AR, a pair of highly doped regions 18p and 18n are formed in a way sandwiching a region beneath the gate electrode 17. In other words, each high withstand voltage MOS transistor HVMOS includes the gate oxide film 13b having the second thickness being thicker than the first thickness which is formed on the active region AR of the semiconductor substrate 11, the gate electrode 17 formed on this gate oxide film 13b, and a pair of highly doped regions 18p or 18n formed in the active region AR.

In the above structure, the semiconductor substrate 11 can be a P type silicon substrate, for instance. In this case, the element isolating insulation films 12 can be formed using, for instance, the STI method.

In certain regions of the semiconductor substrate 11 where N type MOS transistors are formed, P well regions 19p are formed by implanting P type impurities into those regions. In this embodiment, as for the P type impurities, a P type ion such as a boron difluoride ion ($BF_2^+$) can be used, for example. The dose amount of the P type ion can be around $2 \times 10^{15}/cm^2$.

On the other hand, in certain regions of the semiconductor substrate 11 where P type MOS transistors are formed, N well regions 19n are formed by implanting N type impurities into those regions. In this embodiment, as for the N type impurities, an N type ion such as a phosphorous ion ($P^+$) can be used, for example. The dose amount of the N type ion can be around $2 \times 10^{15}/cm^2$.

In certain region of the P well region 19p where channel is formed, P type impurities are diffused for the purpose of adjusting threshold value. In the following, those region will be referred to as threshold adjusting region 20p. As for the P type impurities, a P type ion such as a boron difluoride ion ($BF_2^+$) can be used, for example. The dose amount of the P type ion can be around $2 \times 10^{12}/cm^2$.

On the other hand, in threshold adjusting region 20n of the N well region 19n, N type impurities are diffused for the purpose of adjusting threshold value. As for the N type impurities, an N type ion such as a phosphorous ion ($P^+$) can be used, for example. The dose amount of the N type ion can be around $2 \times 10^{12}/cm^2$.

On the active regions AR on the low withstand voltage side, the gate oxide film 13a having the first thickness is formed, as described above. As for this gate oxide film 13a, for instance, a silicon oxide film ($SiO_x$ film) can be used. In addition, it is also possible to use a silicon nitride film ($SiN_x$ film), for example. The thickness of the gate oxide film 13a, for instance, can be 7 nm (nanometer) provided that the withstand voltage of the low withstand voltage MOS transistor LVMOS is 3.3V, for example.

On the gate oxide film 13a, the gate electrodes 17 are formed, as described above. The gate electrode 17 can be a polysilicon film, for instance. This polysilicon film is made to be electrically conductive by having P type impurities doped thereto, for example. The thickness of the gate electrode 17 can be 200 to 300 nm, for instance.

In each active region AR on the low withstand voltage side, a pair of highly doped regions 18$p$ or 18$n$ are formed in a way sandwiching a region beneath the gate electrode 17, as described above. Here, when an N type MOS transistor is formed, the diffusion regions 18$p$ or 18$n$ should be formed by having P type impurities implanted into the corresponding regions. As for the P type impurities, a P type ion such as a boron difluoride ion ($BF_2^+$) can be used, for example. The dose amount of the P type ion can be around $2\times10^{15}/cm^2$.

On the other hand, when a P type MOS transistor is formed, the diffusion regions 18$p$ or 18$n$ should be formed by having N type impurities implanted into the corresponding regions. As for the N type impurities, an N type ion such as a phosphorous ion ($P^+$) can be used, for example. The dose amount of the N type ion can be around $2\times10^{15}/cm^2$.

On the active regions AR on the high withstand voltage side, the gate oxide film 13$b$ having the second thickness, which is thicker than the first thickness, is formed, as described above. As for this gate oxide film 13$b$, for instance, a silicon oxide film ($SiO_x$ film) can be used. Besides, it is also possible to use a silicon nitride film ($SiN_x$ film), for example. The thickness of the gate oxide film 13$b$, for instance, can be 50 nm provided that the withstand voltage of the high withstand voltage MOS transistor HVMOS is 20V, for example.

On the gate oxide film 13$b$, the gate electrodes 17 are formed, as described above. The gate electrode 17 can be a polysilicon film, for instance. This polysilicon film is made to have a electrically conductive by having P type impurities doped thereto, for example. The thickness of the gate electrode 17 can be 200 to 300 nm, for instance.

In each active region AR on the high withstand voltage side, a pair of highly doped regions 18$p$ or 18$n$ are formed in a way sandwiching a region beneath the gate electrode 17, as described above. Here, in case when an N type MOS transistor is formed, the diffusion regions 18$p$ or 18$n$ should be formed by having P type impurities implanted into the corresponding regions. As for the P type impurities, a P type ion such as a boron difluoride ion ($BF_2^+$) can be used, for example. The dose amount of the P type ion can be around $2\times10^{15}/cm^2$.

On the other hand, when a P type MOS transistor is formed, the diffusion regions 18$p$ or 18$n$ should be formed by having N type impurities implanted into the corresponding regions. As for the N type impurities, an N type ion such as a phosphorous ion ($P^+$) can be used, for example. The dose amount of the N type ion can be around $2\times10^{15}/cm^2$.

Manufacturing Method

Now a method of manufacturing the semiconductor device 1 according to the embodiment of the present invention will be described in detail with reference to the drawings. FIGS. 5 to 8 are diagrams showing processes of manufacturing the semiconductor device 1 according to the first embodiment of the present invention.

In this manufacturing method, first, a semiconductor substrate 11 having P well regions 19$p$ and N well regions 19$n$ is prepared. In this embodiment, a P type silicon substrate is used for the semiconductor substrate 11. The dose amount of the P well regions 19$p$ is $2\times10^{15}/cm^2$, and the dose amount of the N well regions 19$n$ is $2\times10^{15}/cm^2$.

Figure 5A:
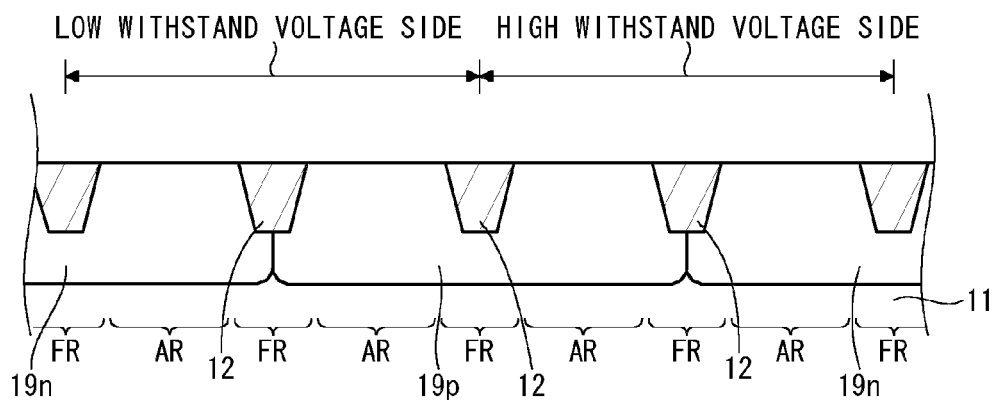
FIG. 5A to FIG. 5C are diagrams showing processes of forming the semiconductor device according to the first embodiment of the present invention.

Next, as shown in FIG. 5A, in order to divide the surface of the semiconductor substrate 11 into active regions AR and field regions FR, element isolating insulation regions 12 are formed in certain regions of the semiconductor substrate 11 using a known STI method.

Figure 5B:
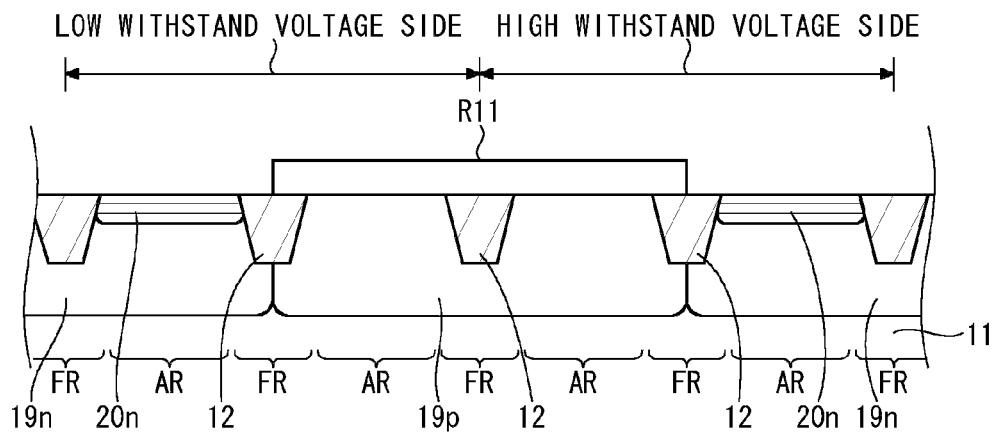

Next, using a known photolithography process, a resist pattern R11 is formed over the certain regions of the semiconductor substrate 11 where N type MOS transistors are formed. Then, using the resist pattern R11 as a mask, P type ions are implanted into the active regions AR, of the semiconductor substrate 11 where N type MOS transistors are formed, for the purpose of adjusting threshold values. Thereby, as shown in FIG. 5B, threshold adjusting regions 20$p$ are formed in the certain regions of the semiconductor substrate 11 where N type MOS transistors are formed. In this case, since the boundaries between the element isolating insulation films 12 and the threshold adjusting regions 20$p$ are self-aligned, the resist pattern R11 should be formed covering at least the P well regions 19$p$. In addition, if boron difluoride ions ($BF_2^+$) are applied as the P type ions in this process, for instance, boron difluoride ions are accelerated to about 5 KeV (kilo electron volt), and the dose amount of the P type ions can be around $1\times10^{12}$ to $3\times10^{12}/cm^2$. After the threshold adjusting regions 20$p$ are formed, the resist pattern R11 is removed.

Figure 5C:
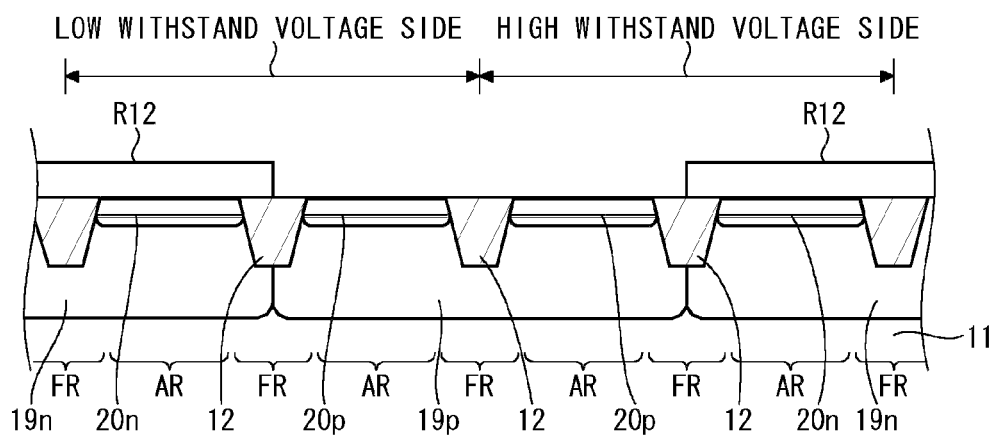

Next, over the certain regions of the semiconductor substrate 11 where P type MOS transistors are formed, a resist pattern R12 is formed using a known photolithography process. Then, using the resist pattern R12 as a mask, N type ions are implanted into the active region AR, of the semiconductor substrate 11 where P type MOS transistors are formed, for the purpose of adjusting threshold value. Thereby, as shown in FIG. 5C, threshold adjusting regions 20$n$ are formed in the certain regions of the semiconductor substrate 11 where P type MOS transistors are formed. In this case, since the boundaries between the element isolating insulation films 12 and the threshold adjusting regions 20$n$ are self-aligned, the resist pattern R12 should be formed covering at least the N well regions 19$n$. In addition, if phosphorous ions ($P^+$) are applied to the N type ions in this process for instance, phosphorous ions are accelerated to about 50 KeV, and the dose amount of the N type ions can be around $1\times10^{12}$ to $3\times10^{12}/cm^2$. After the threshold adjusting regions 20$n$ are formed, the resist pattern R12 is removed.

Figure 6A:
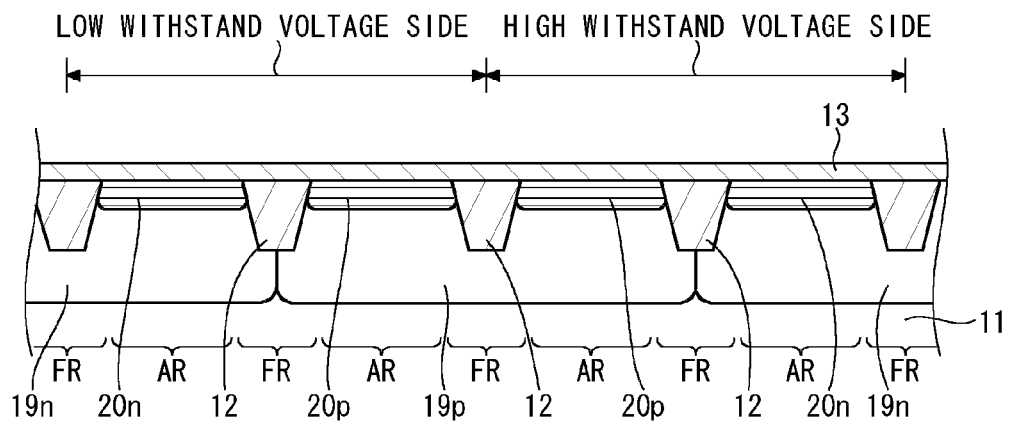
FIG. 6A to FIG. 6C are diagrams showing processes of forming the semiconductor device according to the first embodiment of the present invention.

Next, by conducting a thermal oxidation treatment on the semiconductor substrate 11, as shown in FIG. 6A, a gate oxide film 13 having the first thickness (for instance, 5 nm) is formed over the whole upper surface of the semiconductor substrate 11. Here, as for the conditions of thermal oxidation treatment, for instance, the temperature is set at 850° C. and the heating time is set to 40 minutes.

Figure 6B:
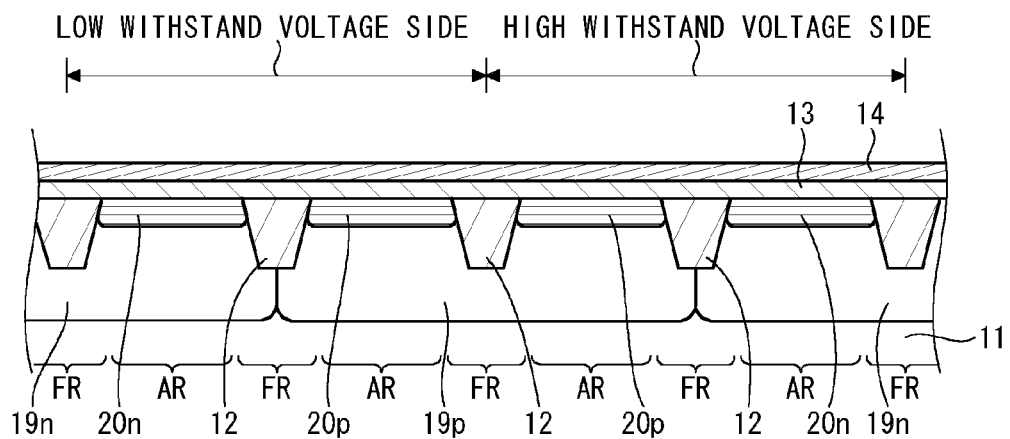

Next, by depositing silicon (Si) over the surface of the semiconductor substrate 11 using the CVD (Chemical Vapor Deposition) method and so on, a polysilicon film 14 having a thickness of 20 nm, for instance, is formed on the gate oxide film 13, as shown in FIG. 6B. As for this polysilicon film 14, it may be a film which includes impurities or a film which does not include impurities. That is, any film is applicable as long it is a film which can be changed into an insulation film by a certain method such as a thermal oxidization treatment and nitriding treatment. In this description, such a film is called a predetermined film.

Figure 6C:
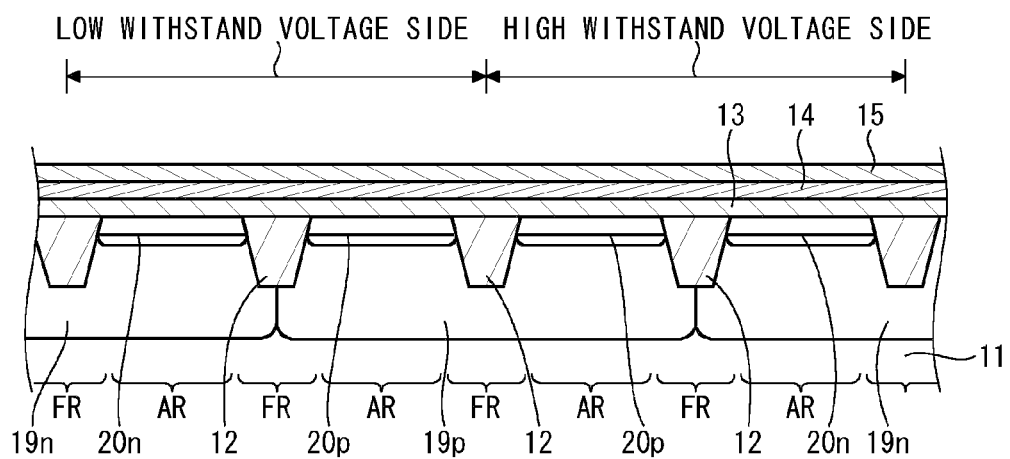

Next, by depositing silicon nitride (SiN) over the surface of the semiconductor substrate 11 using the CVD method and so on, a silicon nitride film 15 having a thickness of 50 to 200 nm, for instance, is formed on the polysilicon film 14, as shown in FIG. 6C.

Figure 7A:
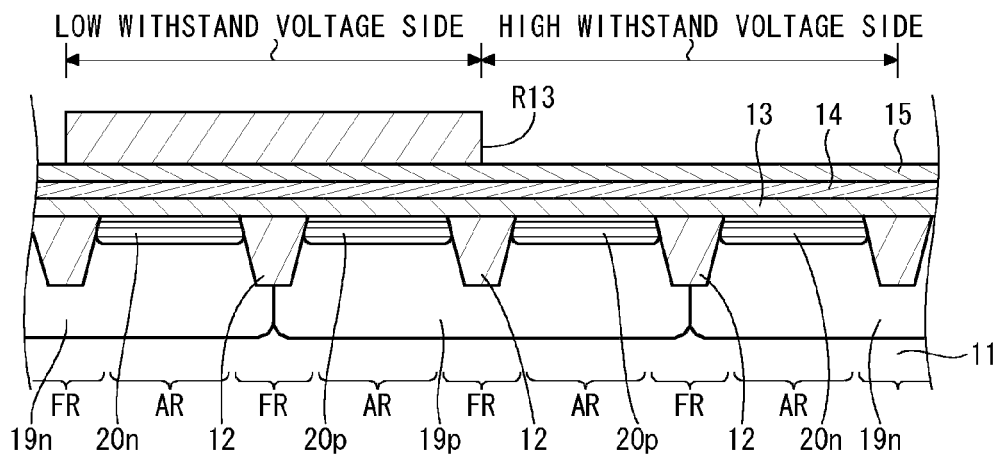
FIG. 7A to FIG. 7C are diagrams showing processes of forming the semiconductor device according to the first embodiment of the present invention.

Next, using a known photolithography process, a resist pattern R13 is formed in the active regions AR of the low withstand voltage side, as shown in FIG. 7A.

Figure 7B:
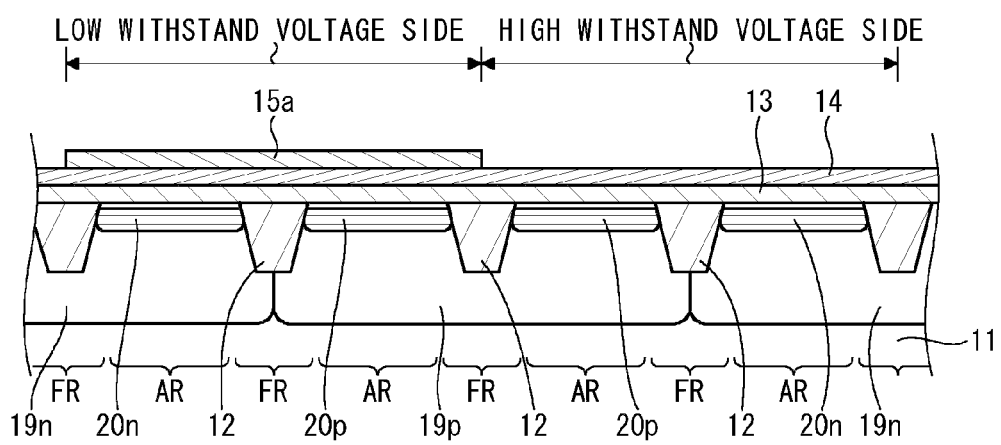

Next, in order to expose the polysilicon film 14 in the active regions AR of the high withstand voltage side and cover the polysilicon film 14 in the active regions AR of the low withstand voltage side with the remaining silicon nitride film 15a, the silicon nitride film 15 is etched using the resist pattern R13 as a mask. After the silicon nitride film 14 is etched, the resist pattern R13 is removed. Accordingly, the structure as shown in FIG. 7B is obtained.

Figure 7C:
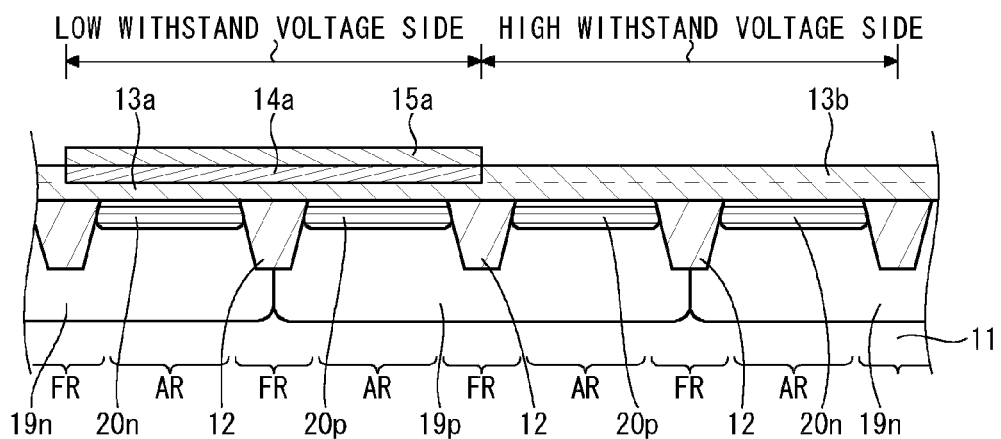

Next, by conducting a thermal oxidation treatment on the semiconductor substrate 11, the exposed part of the polysilicon film 14 is oxidized, as shown in FIG. 7C. In other words, the exposed part of the polysilicon film 14, i.e. a predetermined film, is changed into an insulation film by the thermal oxidation treatment. In this embodiment, the predetermined film is changed into a silicon oxide film. At this time, the silicon nitride film 15a functions as a protective film for preventing the polysilicon film 14 in the active region AR of the low withstand voltage side from being oxidized. By this arrangement, the thickness of the gate oxide films 13b in the active regions AR of the high withstand voltage side becomes the second thickness (e.g. 50 nm) which is thicker than the first thickness of the gate oxide films 13a in the active regions AR of the low withstand voltage side. As for the conditions of thermal oxidation treatment, for instance, the temperature is set at 850° C. and the heating time is set to 30 minutes. However, the present invention is not limited to these conditions, and it is possible to apply any conditions which enable only the exposed part of the polysilicon film 14 to be oxidized completely.

Next, by etching the silicon nitride film 15a and the polysilicon film 14 under the conditions enabling silicon nitride and polysilicon to be etched selectively while making silicon oxide remain, the silicon nitride film 15a and the polysilicon film 14 are removed, as shown in FIG. 8A. With respect to the conditions for etching the silicon nitride film 15a, for instance, it is possible to apply a mixed gas including $CHF_3$ $CF_4$ and $O_2$ as an etching gas. In this case, the flow ratio of the mixed gas is set to about $CHF_3:CF_4:O_2=100:100:3$. With respect to the conditions for etching the polysilicon 14, for instance, it is possible to apply a mixed gas including $Cl_2$ $HBr_3$ and $O_2$ as an etching gas. In this case, the flow ratio of the mixed gas is set to about $Cl_2:HBr_3:O_2=100:10:2\sim3$.

Next, by depositing silicon (Si) over the surface of the semiconductor substrate 11 using the CVD method and so on, a polysilicon film having a thickness of 200 to 300 nm, for instance, is formed on the gate oxide films 13a and 13b. Then, by patterning the polysilicon film using a known photolithography process and etching process, gate electrodes 17 are formed on the gate oxide films 13a and 13b, respectively, as shown in FIG. 8B.

Finally, a resist pattern is formed in the certain regions of the semiconductor substrate 11 where the P type MOS transistors are formed using a known photolithography process, and using the resist pattern as a mask, P type ions are implanted into the active regions AR in the certain regions of the semiconductor substrate 11 where N type MOS transistors are formed so that the dose amount of the implanted regions become around $2\times10^{15}/cm^2$. By this arrangement, highly doped regions 18p are formed in the active regions AR of the semiconductor substrate 11 where N type MOS transistors are formed, as shown in FIG. 4. Furthermore, a resist pattern is formed in the certain regions of the semiconductor substrate 11 where the N type MOS transistors are formed using a known photolithography process, and using the resist pattern as a mask, N type ions are implanted into the active regions AR of the semiconductor substrate 11 where P type MOS transistors are formed so that the dose amount of the implanted regions become around $2\times10^{15}/cm^2$. By this arrangement, highly doped regions 18n are formed in the active regions AR of the semiconductor substrate 11 where P type MOS transistors are formed, as shown in FIG. 4. At this time, since the gate electrodes 17 perform as masks, the highly doped regions 18p and 18n are formed at both sides of the regions beneath the gate electrodes 17, respectively. By this arrangement, the semiconductor device 1 having the low withstand voltage MOS transistors LVMOS and high withstand voltage MOS transistors HVMOS formed on the same semiconductor substrate 11 can be achieved. In addition, an inter-layer insulation film, contact holes and metal wirings are formed in post processes. It is possible to apply known processes for forming them, and therefore detailed descriptions of those processes will be omitted.

As described above, according to embodiment of the present invention, a semiconductor substrate (11) having a structure in which first element forming regions (AR) and second element forming regions (AR) are separated by an element isolating insulation film (12) is prepared. On this semiconductor substrate (11), a first gate insulation film (13) is formed, and then a predetermined film (14) is formed on the first gate insulation film (13). Then a protection film (15a) is formed on the predetermined film (14) over the first element forming regions (AR). While the protection film (15a) serves as a mask, the predetermined film (14) on the second element forming regions (AR) is transformed into an insulation film, as a result of which a second gate insulation film (13b) is formed on the second element forming regions (AR). Then the protective film (15a) and the predetermined film (14) are removed to have the first gate insulation film (13a) exposed at the first element forming regions (AR). Then gate electrodes 17 are formed on the exposed first gate insulation film (13a) and the second gate insulation film (13b), respectively.

According to the present invention, by forming the predetermined layer (14) on the first gate insulation film (13) and then turning it into an insulation film at the high withstand voltage side, gate insulation films (13a and 13b) for the transistors on the low withstand voltage side and for the transistors on the high withstand voltage side can be formed, respectively. According to the present invention, it is not necessary to have a process of etching the first gate insulation film (13) in order to form the gate insulation film (13a) for the low withstand voltage transistors. Therefore, it is possible to prevent dimples from forming at the element isolating insulation films (12) in the vicinity of the element forming regions (AR). As a result, it is made possible to prevent withstand voltage deterioration of the gate insulation films, short circuits of the gates and other possible problems.

In this embodiment, although a silicon oxide film is used for the gate insulation film 13, the present invention is not limited to this condition. For instance, the gate insulation film 13 can be made of silicon nitride. In this case, the protection film over the polysilicon film 14 should be a silicon oxide film. Furthermore, the thermal oxidation treatment as described with reference to FIG. 7(c) can be replaced with a nitriding treatment. In addition, as for the conditions for removing the polysilicon film 14 which remained through the nitriding treatment and the silicon oxide film as the protection film, for instance, it is possible to use a mixed gas of CF4/CHF3 with a mixture rate 1:10 as the etching gas.

While the preferred embodiment of the invention has been described using specific terms, such description is for illustrative purposes only, and it is to be understood that changes and variations may be made without departing from the spirit or the scope of the following claims.

This application claims priority to Japanese Patent Application No. 2005-52298. The entire disclosures of Japanese Patent Application No. 2005-52298 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A method of manufacturing a semiconductor device comprising:
    preparing a semiconductor substrate having first and second element forming regions, the first and second element forming regions being divided by an element separating insulation film;
    forming a first gate insulation film on the semiconductor substrate;
    forming a silicon film on the first gate insulation film;
    forming a protective film on the silicon film in the first element forming region;
    forming a second gate insulation film in the second element forming region by oxidizing the silicon film into an insulation film using the protective film as a mask;
    removing the protective film and the remaining silicon film which is not oxidized into the insulation film; and
    after said removing the protective film and the remaining silicon film, forming exposed gate electrodes on the first and second gate insulation films.

2. The method of manufacturing a semiconductor device according to claim 1, wherein
    the second gate insulation film is formed by a thermal oxidation treatment.

3. The method of manufacturing a semiconductor device according to claim 1, wherein
    the first gate insulation film is a silicon oxide film, and
    the protective film is a silicon nitride film.

* * * * *

UNITED STATES PATENT AND TRADEMARK OFFICE
CERTIFICATE OF CORRECTION

PATENT NO. : 7,585,733 B2 Page 1 of 1
APPLICATION NO. : 11/275825
DATED : September 8, 2009
INVENTOR(S) : Koki Muto It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 551 days.

Signed and Sealed this

Fourteenth Day of September, 2010

David J. Kappos
*Director of the United States Patent and Trademark Office*